(12) United States Patent
Kim et al.

(10) Patent No.: US 6,727,163 B2
(45) Date of Patent: Apr. 27, 2004

(54) METHOD FOR SAWING WAFER (75) Inventors: Dae Young Kim, Chungcheongnam-do (KR); Geun Ho Song, Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/366,299

(22) Filed: Feb. 12, 2003

(65) Prior Publication Data
US 2003/0162313 A1 Aug. 28, 2003

(30) Foreign Application Priority Data

Feb. 25, 2002 (KR) ................ 10-2002-0009879

(51) Int. Cl.[7] .............................. H01L 21/46
(52) U.S. Cl. ...................... 438/464; 438/976
(58) Field of Search ................ 438/113, 458, 438/462–464, 976, 106, 460

(56) References Cited

U.S. PATENT DOCUMENTS

| | | |
|---|---|---|
| 5,516,728 A | 5/1996 | Degani |
| 5,641,714 A * | 6/1997 | Yamanaka ............ 438/14 |
| 6,572,944 B1 * | 6/2003 | Glenn et al. ............ 428/40.1 |
| 6,610,167 B1 * | 8/2003 | Glenn et al. ............ 156/272.2 |

FOREIGN PATENT DOCUMENTS

| | | |
|---|---|---|
| JP | 04-225261 | 8/1992 |
| JP | 04-330766 | 11/1992 |
| KR | 1019990075620 | 10/1999 |
| KR | 1020010010311 | 2/2001 |

OTHER PUBLICATIONS

English translation of Japanese Abstract Patent No. 04-225261.
English translation of Japanese Abstract Patent No. 04-225261.
English translation of Korean Abstract Patent No. 1019990075620.
English translation of Korean Abstract Patent No. 1020010010311.

* cited by examiner

*Primary Examiner*—David Nelms
*Assistant Examiner*—David Vu
(74) *Attorney, Agent, or Firm*—Marger Johnson & McCollom, P.C.

(57) ABSTRACT

A method for sawing a wafer having a large number of semiconductor devices, e.g., image sensor devices is provided. In one embodiment, a protective layer covers micro-lenses of the image sensor devices to protect the lenses from being damaged or polluted by, for example, silicon dust during wafer sawing. The silicon dust remaining in a gap between the devices is removed together with an adhesive tape on the backside surface of the wafer. Accordingly, the silicon dust cannot affect the micro-lenses during the wafer sawing process or subsequent die-attach, so that image defects caused by the silicon dust can be reduced and the yield of the image sensor devices is increased.

16 Claims, 8 Drawing Sheets

METHOD FOR SAWING WAFER

This application claims priority from Korean patent application No. 2002-09879 filed Feb. 25, 2002 in the name of Samsung Electronics Co., Ltd., which is herein incorporated by reference.

BACKGROUND OF THE INVENTION

1. Field of the Invention

The present invention relates to a method for making semiconductor integrated circuit devices, and more particularly, to a method for sawing a wafer.

2. Description of the Related Art

An image sensor device, which is one example of a semiconductor integrated circuit device, has a large number of pixels that convert light into electric signals. A charge-coupled device (CCD) is one such image sensor device. In the CCD, images are obtained when incident light, in the form of photons, falls on the array of pixels. An electronic charge converted from the photon is transferred within a silicon substrate and causes a voltage to be formed. Recently, a CMOS image sensor has been introduced, which is slightly inferior to the CCD in image quality but has a smaller size and lower power consumption.

In such image sensors, most chip surfaces are active regions for detecting images. Thus, the quality of the image sensors and sensitivity depends on its fabrication process. For this reason, the greater pixel density required of the image sensor devices, the greater reduction in the yield of the image sensor devices, presenting significant obstacles to the development of the image sensor devices.

The problems that may arise in the image sensor devices are image defects such as a black defect, a white defect and/or a dark defect. While the black defect is displayed as a black dot on a screen when a signal output of a pixel is below the standard (or the average) illuminance of 4 lux, the white defect is displayed as a white dot under opposite conditions. In addition, a dark defect is displayed as a white dot by thermal generation at zero lux.

The above-mentioned image defects, especially a black defect, may be caused by silicon dust produced in a wafer sawing process. The wafer sawing process and the subsequent die-attach process for a wafer and the effect of silicon dust are explained as follows.

Figure 1:
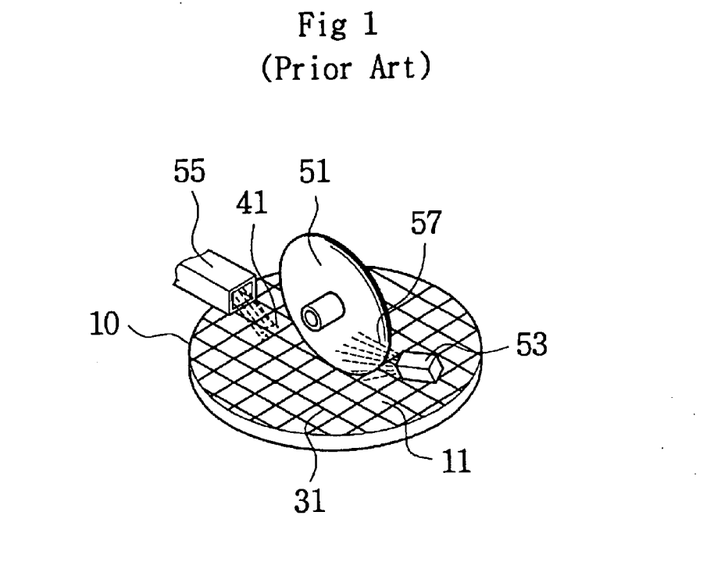
FIG. 1 is a schematic perspective view showing a conventional wafer sawing process for an image sensor device wafer.
Figure 2:
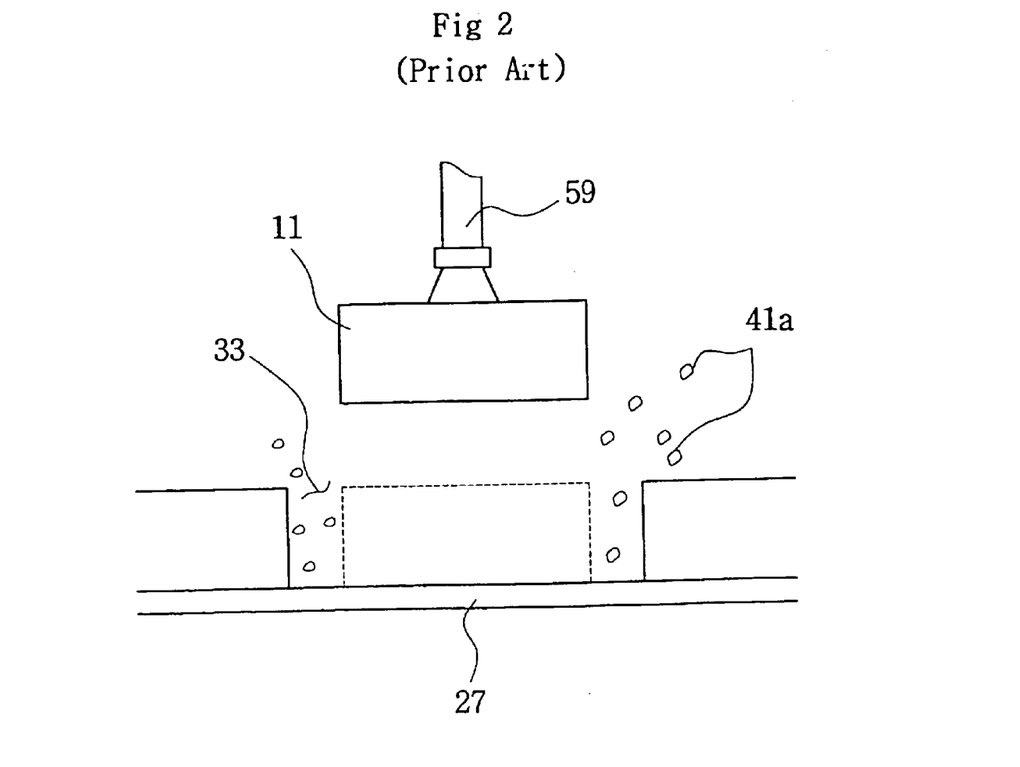
FIG. 2 is a schematic cross-sectional view showing a pickup action in a conventional die-attach process after the wafer sawing process shown in FIG. 1.

Referring to FIGS. 1 and 2, a wafer 10 that is composed of a large number of CCD-type image sensor devices 11 is diced or singulated along scribe lines 31 by a rotating wheel blade 51, and thereby separated into individual image sensor devices 11. This is generally known as a wafer sawing or dicing process. The backside surface of the wafer 10 adheres to an adhesive tape 27 before wafer sawing, and the separated individual devices 11 stay on the adhesive tape 27 even after wafer sawing. The wafer sawing process, however, produces silicon dust 41 that may cause the aforementioned image defects. Therefore, to prevent the silicon dust from remaining on the surface of the wafer 10, a spray nozzle 53 sprays a cleaning solution 57 on the wafer 10 at high pressure. The silicon dust 41 is thus detached from the surface of the wafer 10 and drawn into a suction pipe 55.

The wafer 10 is then moved to a location for a die-attach process. In the die-attach process, a pickup collet 59 picks up one of the individual devices 11 by vacuum force and attaches it to a substrate.

As described above, the wafer sawing process includes removing silicon dust 41 from the surface of the wafer 10 by using the spray nozzle 53 and the suction pipe 55. However, as shown in FIG. 2, such removing action cannot eliminate the silicon dust 41a staying in the gap 33 between the adjacent individual devices 11, particularly the dust adhering to the adhesive tape 27 in the gap 33. The non-removed silicon dust 41a may contaminate the micro-lenses of the device 11 and block the light incident upon the lenses, thereby causing the image defects. This can substantially degrades the display quality. This undesirable phenomenon often occurs when the individual device 11 is detached from the adhesive tape 27 by the pickup collet 59 for the die-attach process.

For a wafer having a thickness of 680 micrometers, a 5~6 percent reduction in yield can be caused by silicon dust during the wafer sawing process, whereas a 8 percent reduction in yield can be caused by the silicon dust during the pickup action for the die-attach process. Therefore, the image sensor devices require more attention to prevent them from being contaminated by the silicon dust than the other semiconductor devices such as memory devices.

SUMMARY OF THE INVENTION

In one embodiment, a wafer having semiconductor devices, e.g., image sensor devices is provided. Each image sensor device has a large number of micro-lenses formed thereon. A protective layer is formed on an active surface of the wafer such that the protective layer covers the micro-lenses. A first adhesive tape is attached to a backside surface of the wafer. Then, the wafer is diced into individual image sensor devices. A second adhesive tape is attached to the protective layer on the active surface of the wafer. The first adhesive tape is removed from the backside surface of the wafer. A third adhesive tape is attached to the backside surface of the wafer. Subsequently, the second adhesive tape is stripped from the active surface of the wafer.

BRIEF DESCRIPTION OF THE DRAWINGS

FIGS. 3 to 12 are cross-sectional views showing a wafer sawing process for an image sensor device wafer in accordance with a preferred embodiment of the present invention.

FIG. 3b is an enlarged cross-sectional view of a part of FIG. 3a.

FIG. 4b is an enlarged cross-sectional view of part of FIG. 4a.

FIG. 5b is an enlarged cross-sectional view of part of FIG. 5a.

FIG. 6b is an enlarged cross-sectional view of part of FIG. 6a.

DETAILED DESCRIPTION OF THE INVENTION

The present invention will be now described more fully hereinafter with reference to accompanying drawings. This invention may, however, be embodied in many different forms and should not be construed as limited to the embodiment set forth herein; rather, this embodiment is provided so that this disclosure will be thorough and complete, and will fully convey the scope of the invention to those skilled in the art.

Figure 3A:
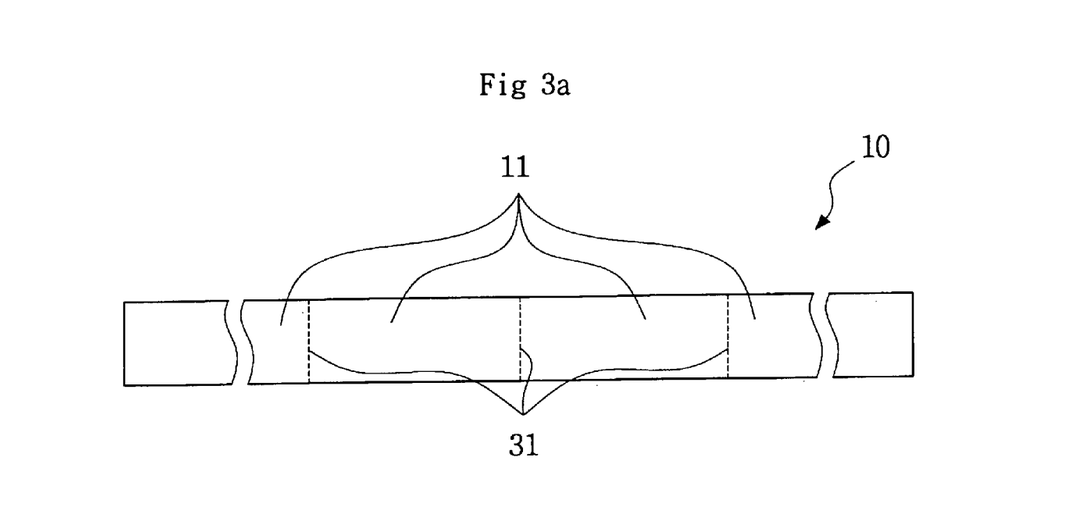
FIG. 3a is a cross-sectional view showing a process of providing the wafer.
Figure 3B:
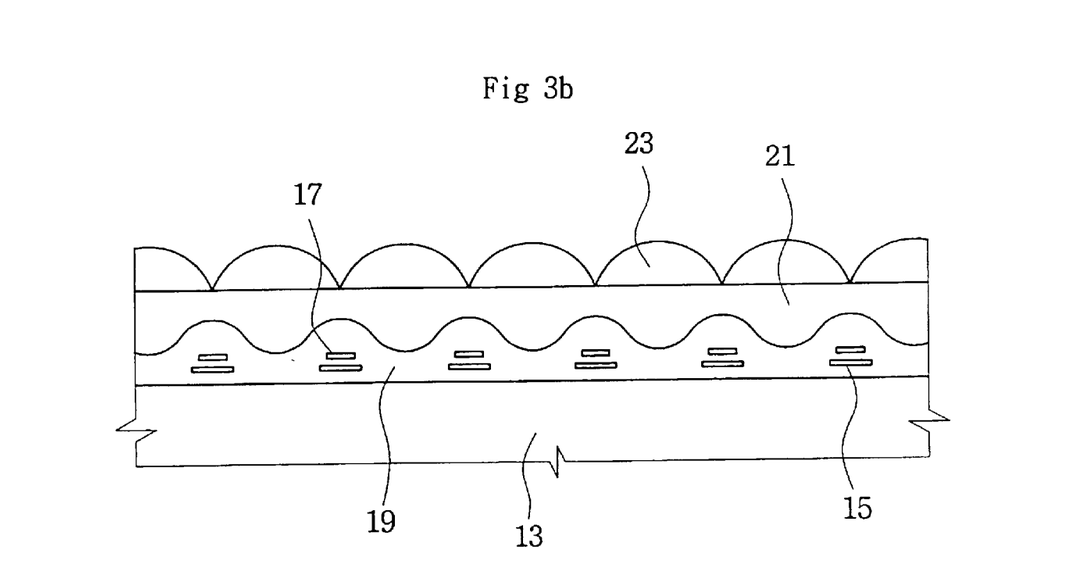

FIG. 3a is a cross-sectional view showing a wafer of image sensor devices, and FIG. 3b is an enlarged cross-sectional view of part of FIG. 3a.

Referring to FIGS. 3a and 3b, the wafer 10 includes a large number of image sensor devices 11 (e.g., CCD-type devices) that will be separated along scribe lines 31. Each image sensor device 11 has a plurality of transmission electrodes 15 formed over a semiconductor substrate 13 and covered with an insulating layer 19. A light-blocking layer 17 is formed above each corresponding electrode 15 within the insulating layer 19. A planarizing layer 21 is formed on the insulating layer 19, and a plurality of micro-lenses 23 are formed on the planarizing layer 21.

Figure 4A:
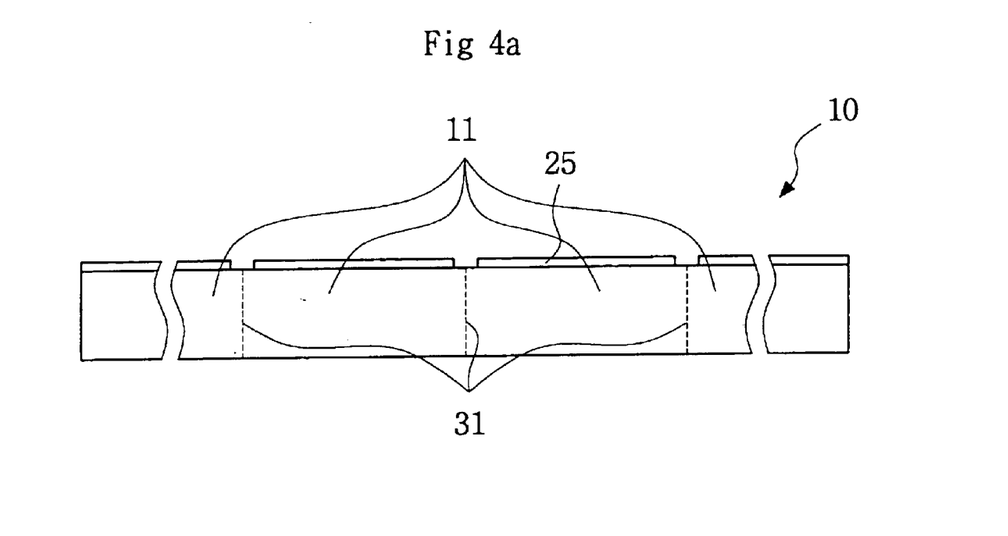
FIG. 4a is a cross-sectional view showing a process of forming a protective layer on the wafer.
Figure 4B:
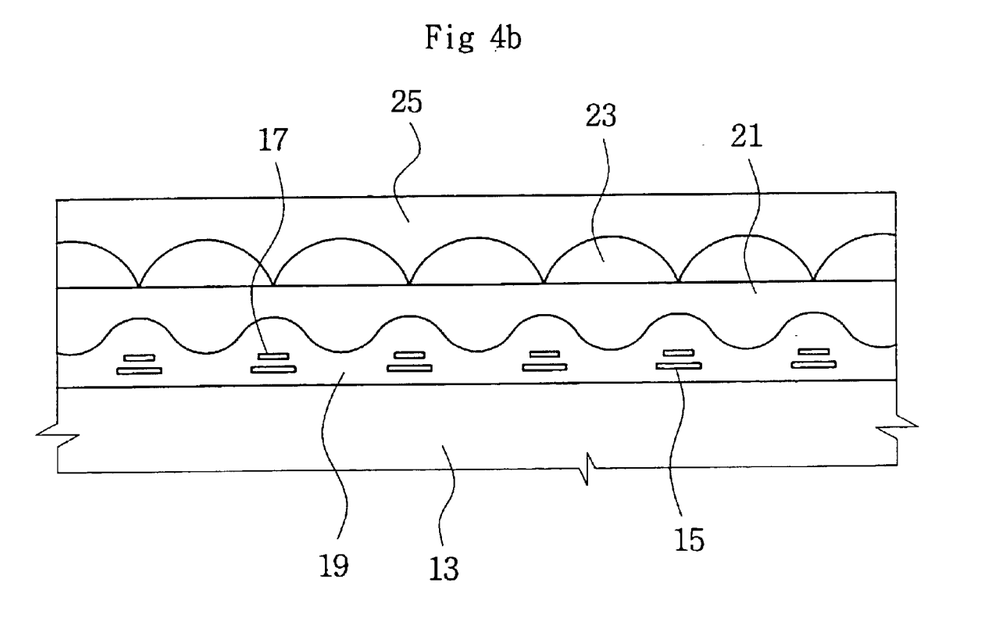

FIG. 4a is a cross-sectional view showing a process of forming a protective layer on the wafer, and FIG. 4b is an enlarged cross-sectional view of part of FIG. 4a.

Referring to FIGS. 4a and 4b, the protective layer 25 is coated on the active surface of the wafer 10 to cover the micro-lenses 23. Preferably, the protective layer 25 is not formed around the scribe lines 31 since the protective layer 25 may delaminate from the force of the rotating wheel blade during the wafer sawing process. For a wafer having a thickness of 680 micrometers, the protective layer 25 has a thickness of about 3~4 micrometers. Preferably, the protective layer 25 comprises a resin material, such as a novolak-based resist. This resin material does not react with the micro lens 23 and does not dissolve in a cleaning solution used in the sawing process. Also, this resin material can be easily dissolved in an organic solvent such as isopropyl alcohol (IPA), methanol or ethanol.

Figure 5A:
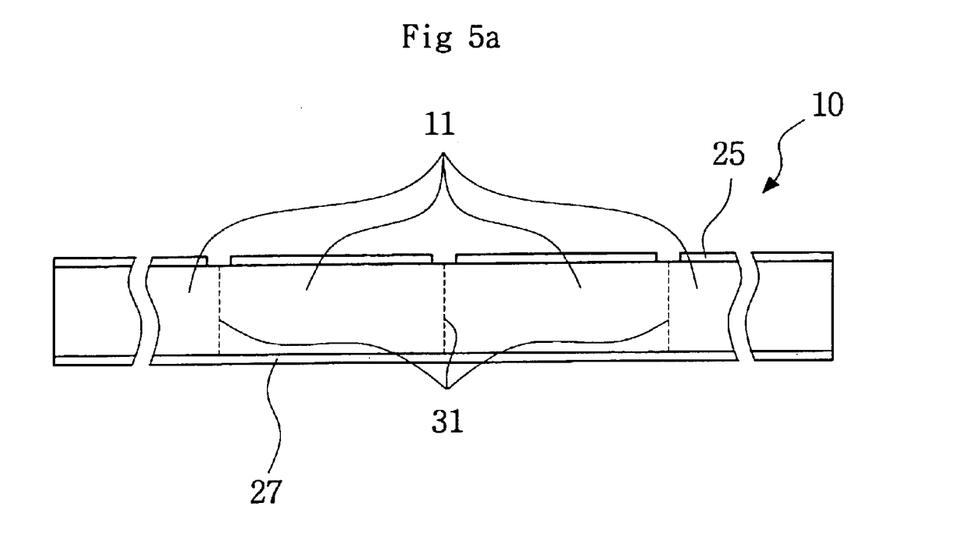
FIG. 5a is a cross-sectional view showing a process of attaching an adhesive tape to the wafer.
Figure 5B:
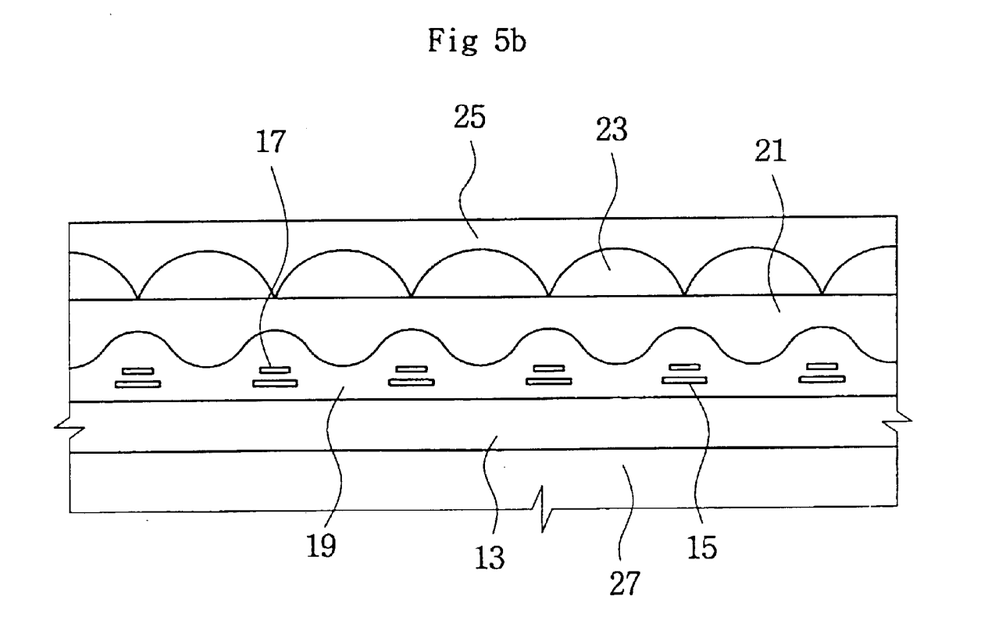

FIG. 5a is a cross-sectional view showing a process of attaching an adhesive tape 27 to the wafer 10, and FIG. 5b is an enlarged cross-sectional view of a part of FIG. 5a.

Referring to FIGS. 5a and 5b, the adhesive tape 27 is attached to the backside surface of the wafer 10. A normal-type tape or a UV tape, which is well known in the art, may be used as the adhesive tape 27. Preferably, the normal-type tape and the UV tape have adhesive strength of about 120±30 g/20 mm and 300~500 g/20 mm, respectively.

Figure 6A:
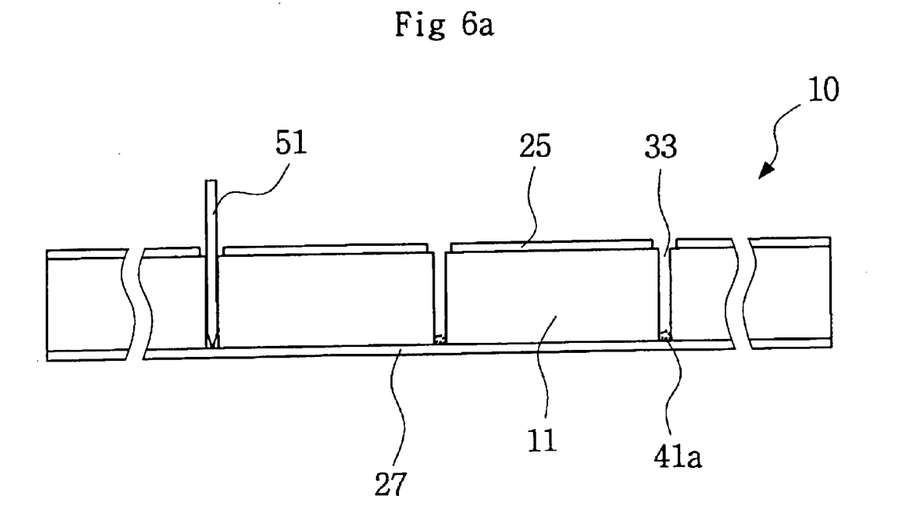
FIG. 6a is a cross-sectional view showing a process of dicing the wafer.
Figure 6B:
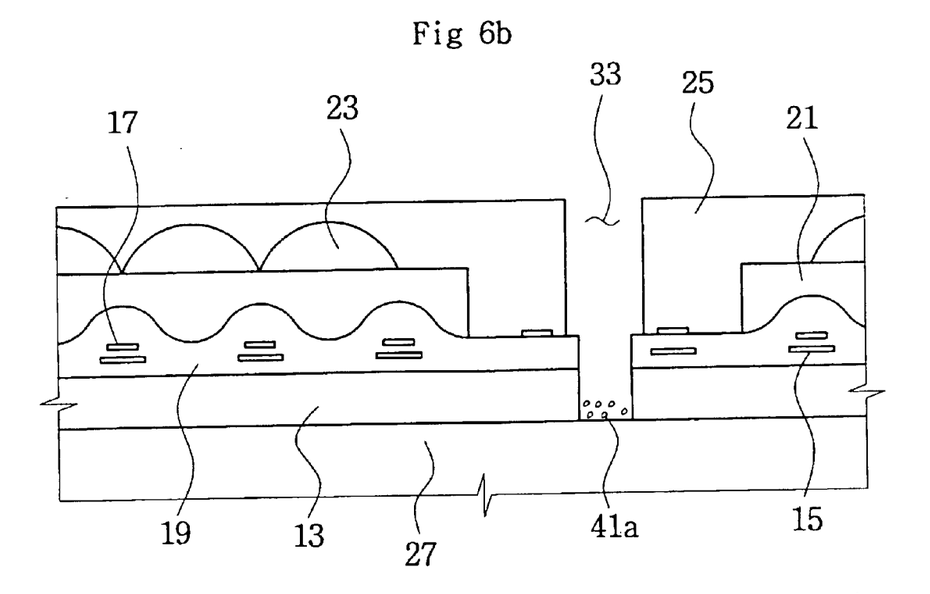

FIG. 6a is a cross-sectional view showing a process of dicing the wafer 10, and FIG. 6b is an enlarged cross-sectional view of part of FIG. 6a.

Referring to FIGS. 6a and 6b, the wafer 10 is diced into individual devices 11 along the scribe lines 31 by the rotating wheel blade 51. As shown in FIGS. 6a and 6b, a cleaning solution such as de-ionized water is sprayed on the wafer 10 to remove heat and silicon dust generated in the wafer sawing process. In particular, the protective layer 25 protects the micro-lenses 23 from being damaged or polluted during the wafer sawing process. The non-removed silicon dust 41a remains on the adhesive tape 27 in a gap 33 between the diced devices 11.

Figure 7:
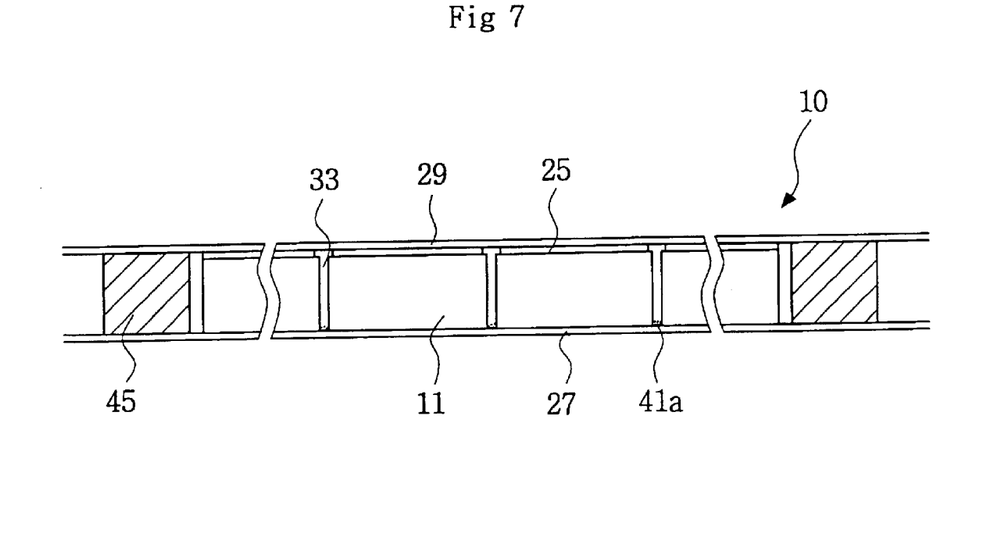
FIG. 7 is a cross-sectional view showing a process of providing a temporary adhesive tape for the wafer.

FIG. 7 is a cross-sectional view showing a process of providing a temporary adhesive tape for the wafer 10.

Referring to FIG. 7, a ring frame 45 is attached on the adhesive tape 27 to surround the periphery of the wafer 10 and then the temporary adhesive tape 29 is temporarily attached on the protective layer 25. That is, contrary to the adhesive tape 27 on the backside surface of the wafer 10, the temporary adhesive tape 29 is provided on the active surface of the wafer 10. The temporary top adhesive tape 29 may be the same kind of tape as the bottom adhesive tape 27. However, a person skilled in the art will appreciate that other types of adhesive tapes can be used for implementing the present invention as long as it is within the spirit and scope of the present invention. The ring frame 45 prevents both tapes 27 and 29 from sticking together and allows both tapes 27 and 29 to be easily detached from the wafer 10.

Figure 8:
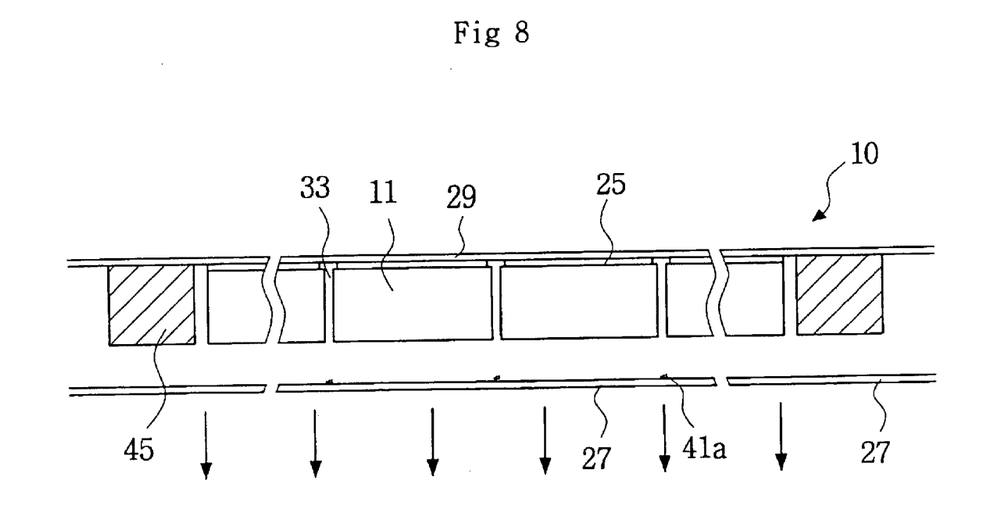
FIG. 8 is a cross-sectional view showing a process of stripping the bottom adhesive tape from the wafer.

FIG. 8 is a cross-sectional view showing a process of stripping the bottom adhesive tape 27 from the wafer 10. As shown in FIG. 8, the bottom adhesive tape 27 is removed from the backside surface of the wafer 10 using the methods known in the art, for example, applying ultraviolet rays to remove the UV tape. By stripping the adhesive tape 27, the silicon dust 41a remaining on the adhesive tape 27 is also removed. Therefore, problems resulting from the silicon dust 41a can be easily prevented. The temporary top adhesive tape 29, instead of the stripped bottom adhesive tape 27, supports the separated individual devices 11.

Figure 9:
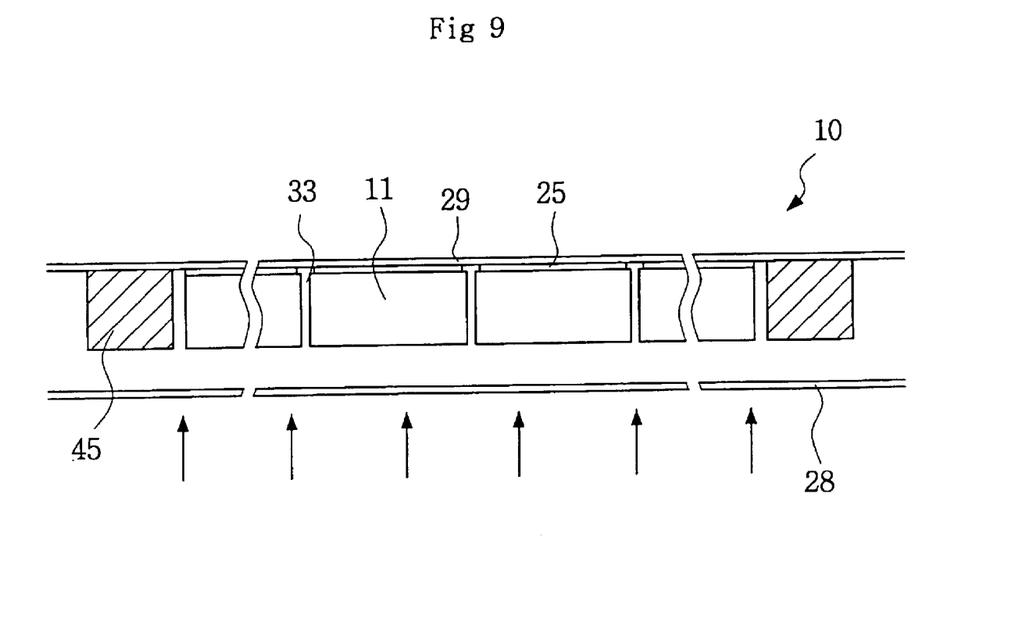
FIG. 9 is a cross-sectional view showing a process of attaching a new bottom adhesive tape to the wafer.

FIG. 9 is a cross-sectional view showing a process of attaching a new bottom adhesive tape to the wafer 10. As shown in FIG. 9, the backside surface of the wafer 10 receives a new adhesive tape 28, which may be of the same type as the one that was previously removed, but is a dust-free.

Figure 10:
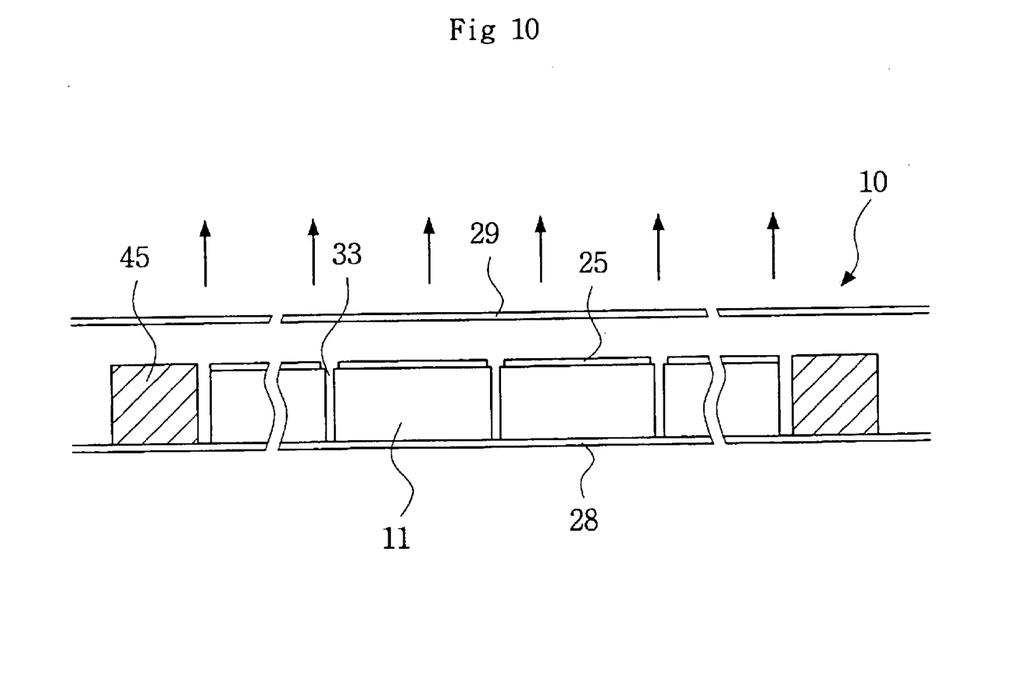
FIG. 10 is a cross-sectional view showing a step of stripping the temporary top adhesive tape from the wafer.
Figure 11:
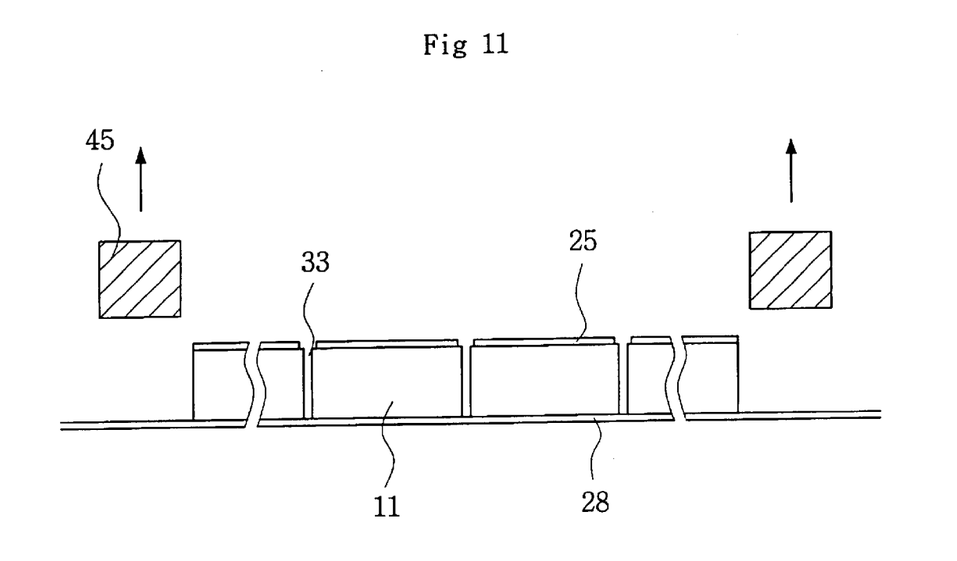
FIG. 11 is a cross-sectional view showing a step of detaching the ring frame from the wafer.

FIGS. 10 and 11 are cross-sectional views showing a process of stripping the temporary top adhesive tape 29 from the wafer 10 and a process of detaching the ring frame 45 from the wafer 10, respectively. As shown in FIG. 10, the temporary adhesive tape 29 is removed from the active surface of the wafer 10, and the ring frame 45 is also removed from the bottom adhesive tape 28, as shown in FIG. 11. Both removal steps may be concurrently or sequentially performed using ultraviolet rays in case of the UV tapes.

Figure 12:
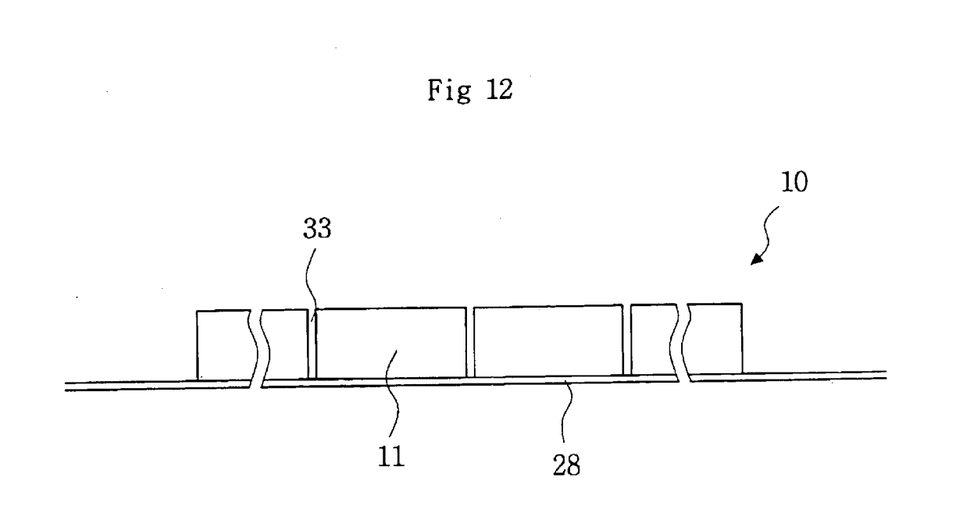
FIG. 12 is a cross-sectional view showing a process of removing the protective layer from the wafer.

FIG. 12 is a schematic cross-sectional view showing a process of removing the protective layer 25 from the wafer 10. The protective layer 25 can be dissolved (removed) in an organic solvent such as isopropyl alcohol (IPA), methanol or ethanol. Thereafter, the wafer 10 is transported to the die-attach process without silicon dust.

As described hereinbefore, according to an embodiment of the present invention, the present invention employs a protective layer covering the micro-lenses of the image sensor device to protect the lenses from being damaged or polluted by silicon dust. In addition, remaining silicon dust in the gap between the separated (diced) devices is removed together with the bottom adhesive tape 27 on the backside surface of the wafer 10. Accordingly, silicon dust cannot affect the micro-lenses during the wafer sawing process or the die-attach process. Thus, image defects caused by silicon dust can be considerably reduced and the yield of the image sensor devices is increased. Although the above-described embodiment uses CCD-type image sensor devices, the present invention can also be applied to other devices having an active region for various functions including detecting an image.

In the drawings and specification, there has been disclosed a preferred embodiment of the invention and, although specific terms are employed, they are used in a generic and descriptive sense only and not for purposes of limitation, the scope of the invention being set forth in the following claims.

What is claimed is:

1. A method for sawing a wafer, the method comprising:
   providing a wafer having a plurality of image sensor devices on an active surface thereof, each device having a plurality of micro-lenses formed thereon;
   forming a protective layer on the active surface of the wafer, the protective layer covering the micro-lenses;
   attaching a first adhesive tape to a backside surface of the wafer;
   dicing the wafer into individual image sensor devices;
   attaching a second adhesive tape to the protective layer; and
   stripping the first adhesive tape from the backside surface of the wafer.

2. The method of claim 1, further comprising:
   attaching a third adhesive tape to the backside surface of the wafer;
   stripping the second adhesive tape from the active surface of the wafer; and
   removing the protective layer from the active surface of the wafer.

3. The method of claim 1, wherein the protective layer is formed of resin material.

4. The method of claim 3, wherein the resin material comprises a novolak-based resist.

5. The method of claim 1, wherein removing the protective layer comprises using an organic solvent.

6. The method of claim 5, wherein the organic solvent is selected from the group consisting of isopropyl alcohol, methanol and ethanol.

7. The method of claim 1, further comprising:
   attaching a device that separates the first tape from the second tape to the first adhesive tape before the attaching the second adhesive tape.

8. The method of claim 7, wherein the device surrounds a periphery of the wafer.

9. The method of claim 7, wherein the device is a ring frame.

10. The method of claim 1, wherein each of the first, second and third adhesive tapes is a normal-type tape having an adhesive strength of 120±30 g/20 mm.

11. The method of claim 1, wherein each of the first, second and third adhesive tapes is an ultraviolet tape having an adhesive strength of 300~500 g/20 mm.

12. The method of claim 1, wherein the protective layer is selectively formed such that scribe lines of the wafer are exposed.

13. The method of claim 1, wherein the image sensor device is a charge-coupled device.

14. A method for sawing a wafer, the method comprising:
   forming a protective layer on an active surface of a wafer having a plurality of semiconductor devices;
   attaching a first adhesive tape to a backside surface of the wafer;
   dicing the wafer into individual semiconductor devices;
   attaching a second adhesive tape to the protective layer; and
   stripping the first adhesive tape from the backside surface of the wafer.

15. The method of claim 14, further comprising:
   attaching a third adhesive tape to the backside surface of the wafer;
   stripping the second adhesive tape from the active surface of the wafer; and
   removing the protective layer from the active surface of the wafer.

16. The method of claim 14, further comprising:
   attaching a device that separates the first tape and the second tape to the first adhesive tape before attaching the second adhesive tape.

* * * * *